(12) United States Patent
Chung et al.

(10) Patent No.: US 8,841,839 B2
(45) Date of Patent: Sep. 23, 2014

(54) DISPLAY DEVICE

(71) Applicant: LG Display Co., Ltd., Seoul (KR)

(72) Inventors: Jang Kyun Chung, Paju-si (KR); Soon Jae Hwang, Paju-si (KR); Kyung Yun Kang, Jinju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/107,549

(22) Filed: Dec. 16, 2013

(65) Prior Publication Data

US 2014/0177190 A1   Jun. 26, 2014

(30) Foreign Application Priority Data

Dec. 21, 2012   (KR) .................. 10-2012-0151213
Nov. 22, 2013   (KR) .................. 10-2013-0143085

(51) Int. Cl.
*H05B 33/02*   (2006.01)
*H05K 7/02*   (2006.01)

(52) U.S. Cl.
CPC ........................ *H05K 7/02* (2013.01)
USPC ...................................................... 313/505

(58) Field of Classification Search
CPC ............ H01L 27/3276; H01L 27/3244; H01L 21/76838; H01L 2224/48; H01L 27/3248; H01L 23/48; H01L 2224/48227; H01L 23/4824; H05B 33/06; H02J 13/0062; H02J 13/0075; H02J 13/001; H02J 13/002; H02J 13/0072; H02J 2003/143; H02J 3/14; H02J 2003/146; H05K 7/02
USPC ................................................. 313/498–512
See application file for complete search history.

*Primary Examiner* — Donald Raleigh
(74) *Attorney, Agent, or Firm* — Brinks Gilson & Lione

(57) ABSTRACT

A display device is disclosed which prevents an overshoot of a current flowing from a power supply unit toward a pixel portion, by connecting a wire extending from the power supply unit and another wire extending from the pixel portion using a wire connection portion with a slope shape or a stepped shape.

10 Claims, 5 Drawing Sheets

DISPLAY DEVICE

The present application claims priority under 35 U.S.C. §119(a) of Korean Patent Application No. 10-2012-0151213 filed on Dec. 21, 2012, and 10-2013-0143085 filed on Nov. 22, 2013, which is hereby incorporated by reference in its entirety.

BACKGROUND

1. Field of the Disclosure

The present application relates to a display device.

2. Description of the Related Art

Recently, a variety of flat panel display devices with reduced weight and volume to address the disadvantages of cathode ray tube (CRT) are being developed. The flat panel display devices include liquid crystal display (LCD) devices, field emission display (FED) devices, plasma display panels (PDPs), electroluminescence devices and so on.

The PDPs have advantages such as a simple manufacture process, lightness and thinness, and are easy to provide a large-sized screen. In view of these points, the PDPs attract public attention. However, the PDPs have serious problems such as low light emission efficiency, low brightness and high power consumption. Thin film transistor LCD devices are widely used as the flat display devices, but have disadvantages such as a narrow viewing angle and a low response time. The electroluminescence display devices are classified into an inorganic light emitting display device and an organic light emitting display device on the basis of the formation material of a light emission layer. The organic light emitting display device corresponding to a self-illuminating display device has features such as high response time, high light emission efficiency, high brightness and wide viewing angle.

Each of such display devices includes a panel used to display images. With the development of the display devices, a power wiring used to transfer power to internal components of the display device must be complex. Particularly, each pixel region within the display device is defined into a very small size. As such, the power wiring connected to the very-small-sized region must become finer. In other words, the power wiring extending from a power supply unit, which applies power voltages, must become finer as it approaches each component. The fine power wiring can steeply increase in resistance and frequently cause a current overshoot phenomenon, which forces currents to converge at a point with the steeply increased resistance. The frequent generation of the current overshoot phenomenon can force the power wiring not to endure an overcurrent, and furthermore damage the power wiring. Due to this, image quality of the panel (or the display device) can deteriorate and the display panel cannot be normally driven.

SUMMARY

According to one general aspect of the present embodiment, a display device includes: a pixel portion; and a power wiring connected to the pixel portion and configured to include a first power wire, a second power wire which is formed to have a narrower width than that of the first power wire and extend from the pixel portion, and a wire connection portion which is connected between the first and second power wires, wherein the wire connection portion gradually narrows in width as it goes from the first power wire toward the second power wire.

The display device according to another general aspect of the present embodiment includes: a pixel portion; and a power wiring connected to the pixel portion and configured to include a first power wire, a second power wire which is formed to have a narrower width than that of the first power wire and extend from the pixel portion, and a wire connection portion which is connected between the first and second power wires. The wire connection portion is formed in a stepped shape.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated herein and constitute a part of this application, illustrate embodiment(s) of the present disclosure and together with the description serve to explain the disclosure. In the drawings.

DETAILED DESCRIPTION OF THE EMBODIMENTS

Figure 1:
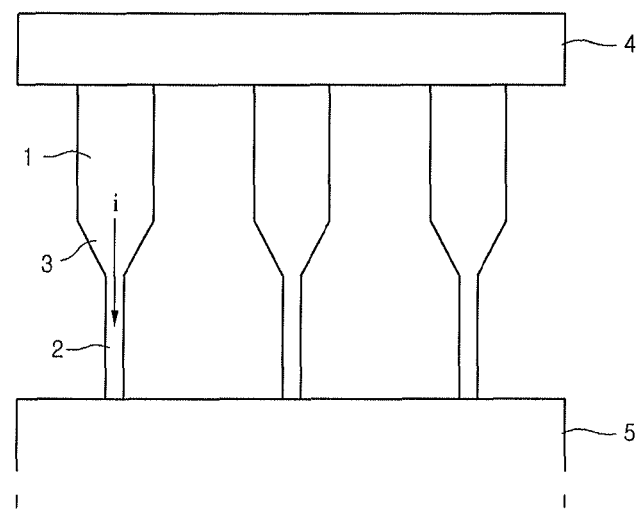
FIG. 1 is a planar view showing a power wiring of a panel according to a first embodiment of the present disclosure.

Reference will now be made in detail to display devices according to embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. In the drawings, the size, thickness and so on of a device can be exaggerated for convenience of explanation. Wherever possible, the same reference numbers will be used throughout this disclosure including the drawings to refer to the same or like parts.

FIG. 1 is a planar view showing a power wiring of a panel within a display device according to a first embodiment of the present disclosure.

Referring to FIG. 1, the power wiring of the panel within the display device according to a first embodiment of the present disclosure can include a power supply unit 4, a first power wire 1, a second power wire 2 and a pixel portion 5.

The power supply unit 4 can generate power voltages necessary to drive the pixel portion 5. Each of the power voltages can be applied from the power supply unit 4 to the pixel portion 5 through the first and second power wires 1 and 2.

The pixel portion 5 can be structurally varied along a kind of a display panel to which it is applied.

As a typical example, the pixel portion 5 applied to an LCD device defines pixel regions by crossing gate lines and data lines, applies a data signal to each pixel through a switching operation of a thin film transistor which responds to a gate voltage on the gate line, thereby displaying images. To this end, a gate driver configured to apply gate signals to the gate lines, a data driver configured to apply the data signals to the data lines and a timing controller configured to control the gate and data drivers are included into the LCD device. Also, power voltages are necessary to drive the gate and data drivers and the timing controller as well as the pixel portion 5. As such, these components can be driven by power voltages which are applied from the power supply unit 4 of the present disclosure. In accordance therewith, the power supply unit 4 must be connected to the gate and data drivers and the timing controller. To this end, the first and second wires 2 and 3 are used for the connection of the power supply unit 4 with components of the LCD device, in order to drive the gate and data driver, the timing controller, the pixel portion 5 and the other components.

As another example, the pixel portion 5 can be applied to an OLED device. The OLED device corresponding to a self-luminous device has features of high response speed, high luminous efficiency, high brightness and wide viewing angle. However, the pixel portion 5 applied to the OLED device forces each pixel to further include a drive transistor with the exception of the switching transistor, unlike that of the LCD device. As such, the pixel portion 5 for displaying an image on a screen (or panel) of the OLED device must have a very complex wiring. Also, a relatively large-sized power supply unit 4 must be used to apply power voltages to relatively small-sized components of each pixel within the pixel portion 5. To this end, the power supply unit 5 can be connected to the components within the pixel portion 5 using the first and second power wires 1 and 2, and supply the power voltages to the components with the pixel portion 5.

The first power wire 1 can include a plurality of wires extending from the power supply unit 4. Also, the plurality of first power wires 1 can be connected to a plurality of second power wires 2 extending from the pixel portion 5.

The pixel portion 5 can be defined into a plurality of pixel regions. Also, the pixel portion 5 must apply the power voltages to each of the pixel regions. As such, the width of the second power wire 2, which is used to apply the power voltage to the pixel region, must become narrower than that of the first power wire 1.

The wire connection portion 3 narrowly extends from the end of the first power wire 1 to the end of the second power wire 2 in such a manner as to gradually incline in a fixed angle.

More specifically, a current "i" generated in the power supply unit 4 is applied to the pixel portion 5 through the first and second power wires 1 and 2 and the first power wire 1 is formed in a wider width than that of the second power wire 2. As such, the wire connection portion 3 can connects the first power wire 1 with the second power wire 2 in such a manner as to gradually and narrowly extend from the first power wire 1 to the second power wire 2 in an inclination of a fixed angle. In other words, the first power wire 1 can be connected to the second power wire 2 in such a manner as to gradually reduce the width difference between the first and second power wires 1 and 2.

In accordance therewith, the generation of a current overshoot at the connection region of the first and second power wires 1 and 2 can be prevented. Moreover, damage of the power wiring due to the generation of the current overshoot can be prevented.

The first power wire 1 can be formed from the same material as the second power wire 2. The first and second power wires 1 and 2 formed from the same material can prevent a current overshoot phenomenon which can be caused by a steep variation of the resistance at a connection point of different material power wires.

The first and second power wires 1 and 2 can be formed from a metal material, but they are not limited to this. Also, the first and second power wires 1 and 2 and the wire connection portion 3 can be formed from the same material and in a single body.

Figure 2:
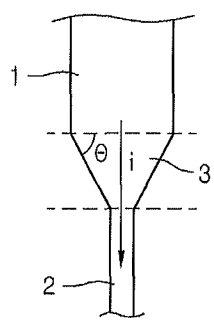
FIG. 2 is an enlarged planar view showing a wire connection portion of the power wiring in FIG. 1.

FIG. 2 is an enlarged planar view showing in detail a connection portion of the power wiring on the panel of the display device shown in FIG. 1.

As shown in FIG. 2, the wire connection portion 3 connects the first power wire 1 with the second power wire 2.

The wire connection portion 3 can have both side edges inclined inward from ends of both side edges of the first power wire 1 in a fixed angle θ with respect to a perpendicular line to the side edges of the first power wire 1.

The fixed angle θ can depend on the widths and lengths of the first and second power wires 1 and 2.

If the second power wire 2 has a narrower width and a shorter length compared to those of the first power wire 1, a current overshoot can be generated in the wire connection portion 3 when a current "i" from the first power wire 1 passes through the second power wire 2. To address this matter, the wire connection portion 3 gradually narrowing in the inclination of the fixed angle θ can allow obstructive degree against the current "i" flowing from the first power wire 1 to the second power wire 2 to be gradually enlarged.

In accordance therewith, the generation of the current overshoot in the wire connection portion 3 can be prevented, and furthermore damage of the power wiring can be prevented.

Figure 3:
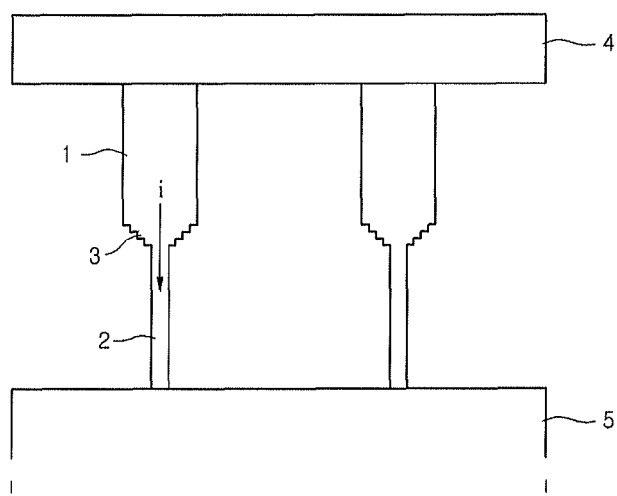
FIG. 3 is a planar view showing a power wiring of a panel according to a second embodiment of the present disclosure.

FIG. 3 is a planar view showing a power wiring of a panel within a display device according to a second embodiment of the present disclosure.

The display device of the second embodiment has a similar configuration to that of the first embodiment. As such, the components of the second embodiment having the same function and shape as those of the first embodiment will be referred to by the same reference numbers and names. Also, the description of the second embodiment overlapping with the first embodiment will be omitted.

Referring to FIG. 3, the display device according to a second embodiment of the present disclosure can include a power supply unit 4, a pixel portion 5, a first power wire 1 and a second power wire 2.

The power supply unit 4 can apply power voltages necessary to drive the pixel portion 5.

The first power wire 1 and the second power wire 2 can be connected to each other. As such, the power supply unit 4 and the pixel portion 5 can be connected to each other through the first and second power wires 1 and 2.

The width of the second power wire 2 can become narrower than that of the first power wire 1.

In this case, the wire connection portion 3 for connecting the first and second power wires 1 and 2 with each other can be formed in a stepped shape.

In detail, the wire connection portion 3 can extend from the end of the first power wire 1 to the end of the second power wire 2 in such a manner that its width gradually narrows in the stepped shape by enabling its both side edges to gradually progress in inward directions.

In other words, although the first power wire 1 is formed in a wider width compared to the second power wire 2, the wire connection portion 3 gradually narrowing from the end of the first power wire 1 to the end of the second power wire 2 can gradually increase its resistance as it goes from the end of the first power wire 1 to the end of the second power wire 2. As such, the wire connection portion 3 with the gradually narrowed width can prevent an overcurrent which can be caused by a current "i" concentrating at a steeply narrowed point of the wire. Also, damage of the power wiring can be prevented.

The first power wire 1 can be formed from the same material as the second power wire 2.

The first and second power wires 1 and 2 formed from the same material can prevent a current overshoot phenomenon which can be caused by a steep variation of the resistance when a current passes through the first and second power wires 1 and 2. The steep variation of the resistance can be generated by a material difference between the first and second power wires 1 and 2. As such, damage of the power wiring can be prevented.

The first and second power wires 1 and 2 can be formed from a metal material, but they are not limited to this.

Figure 4:
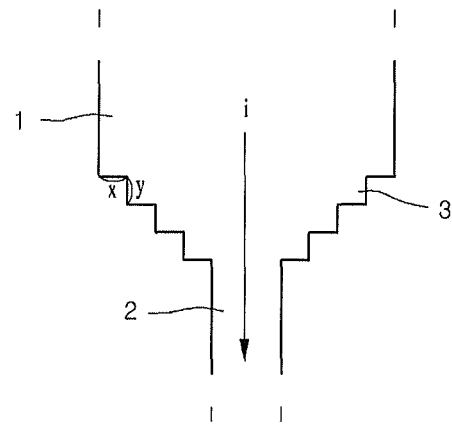
FIG. 4 is an enlarge view showing an example of a wire connection portion of the power wiring in FIG. 3.

FIG. 4 is an enlarge view showing in detail an example of a wire connection portion of the power wiring on the panel of the display device shown in FIG. 3.

As shown in FIG. 4, the wire connection portion 3 can be formed in a stepped shape.

The wire connection portion 3 with the stepped shape can gradually increase the resistance against the current flowing from the first power wire 1 to the second power wire 2. The stepped shape of the wire connection portion 3 can be modified along the widths and lengths of the first and second power wires 1 and 2. If the second power wire 2 has a narrower width and a short length compared to those of the first power wire 1, x and y axes lengths in each stair of the wire connection portion 3 can be shortened. In other words, the wire connection portion 3 can include the large number of stairs.

As such, the resistance against the current "i" flowing from the first power wire 1 to the second power wire 2 is more gradually enlarged due to the large number of stairs included in the wire connection portion 3. In accordance therewith, the generation of an overcurrent in the wire connection portion 3 can be prevented.

Figure 5:
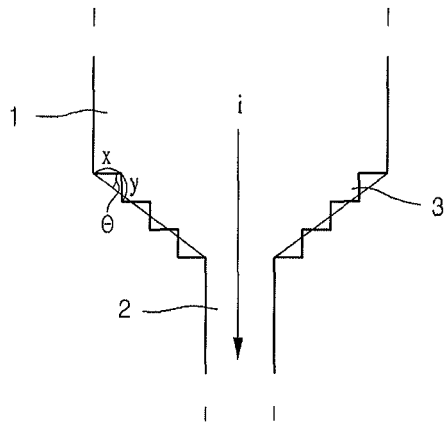
FIG. 5 is an enlarge view showing another example of a wire connection portion of the power wiring in FIG. 3.

FIG. 5 is an enlarge view showing in detail another example of a wire connection portion of the power wiring on the panel of the display device shown in FIG. 3.

As shown in FIG. 5, an angle θ of the wire connection portion 3 of the stepped shape with respect to a perpendicular line to both edges of the first power wire 1 can be enlarged, in order to increase the resistance against the current "i", which flows from the first power wire 1 to the second power wire 2, by a minimum unit (or a minimum scale level).

The resistance against the current "i" passing through the wire connection portion can steeply increase by the width, length and formation material of the second power wire 2. To address this matter, not only the wire connection portion 3 can be provided with the large number of stairs by shortening the x and y axes lengths of each stair but also the angle θ can increase by more enlarging the y axis length than the x axis length.

In this case, the resistance against the flowing of a current "i" can gradually increase in a minimum unit (or a minimum scale level). In accordance therewith, a current overshoot phenomenon, which can be caused by the current "i" steeply concentrating in the wire connection portion 3, can be prevented. Also, the power wiring can provide a current path suitable for the stable flow of a current "i".

Figure 6:
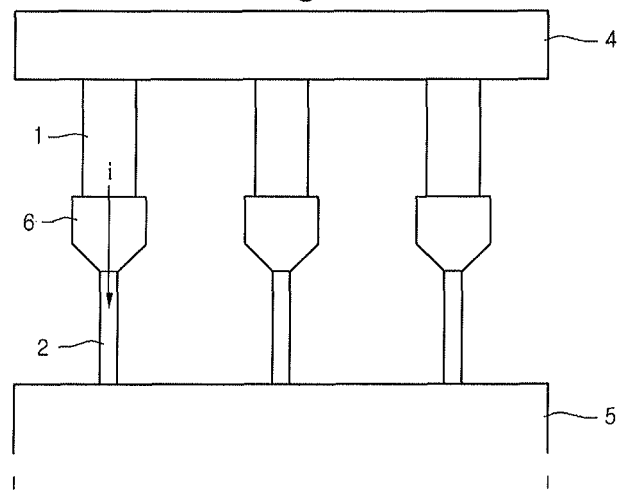
FIG. 6 is a planar view showing a power wiring of a panel according to a third embodiment of the present disclosure.

FIG. 6 is a planar view showing a power wiring of a panel within a display device according to a third embodiment of the present disclosure.

The display device of the third embodiment has a similar configuration to those of the first and second embodiments. As such, the components of the third embodiment having the same function and shape as those of the first and second embodiments will be referred to by the same reference numbers and names. Also, the description of the third embodiment overlapping with the first and second embodiments will be omitted.

Referring to FIG. 6, the power wiring of the panel within the display device according to a third embodiment of the present disclosure can include a power supply unit 4, a pixel portion 5, a first power wire 1, a second power wire 2 and a wire connection portion 6.

The power supply unit 4 can apply power voltages to components of the pixel portion 5 including thin film transistors.

The wire connection portion 6 can connect the first power wire 1 with the second power wire 2. A connection method, which forms the wire connection portion 6 into a contact hole and connects the first and second power wires 1 and 2 using the wire connection portion 6, can be employed. However, the connection method is not limited to this.

The width of the second power wire 2 can be different from that of the first power wire 1.

In other words, the second power wire 2 can have a narrower width compared to that of the first power wire 1. Due to this, an overcurrent can be generated at a connection point of the first and second power wires 1 and 2 by a steep increment of the current "i" which flows from the first power wire 1 to the second power wire 2. To address this matter, the wire connection portion 6 can be formed in such a manner that its width gradually narrows as it goes from the first power wire 1 to the second power wire 2.

As such, the resistance of the power wiring can gradually increase without any steep increment. In accordance therewith, a current "i" stably passes through the first and second power wires 1 and 2. Also, the generation of an overcurrent at the connection point of the first and second power wires 1 and 2 can be prevented.

The first power wire 1 can be formed from the same material as the second power wire 2, but it is not limited to this.

The first and second power wires 1 and 2 formed from the same material can reduce an overcurrent that is caused by a current "I" being concentrated in the wire connection portion 3 due to a steep variation of the resistance. The steep variation of the resistance can be generated by a material difference between the first and second power wires 1 and 2.

The wire connection portion 6 can be formed from a metal material, but they are not limited to this. Also, the first and second power wires 1 and 2 and the wire connection portion 6 can be formed from the same material and in a single body.

Figure 7:
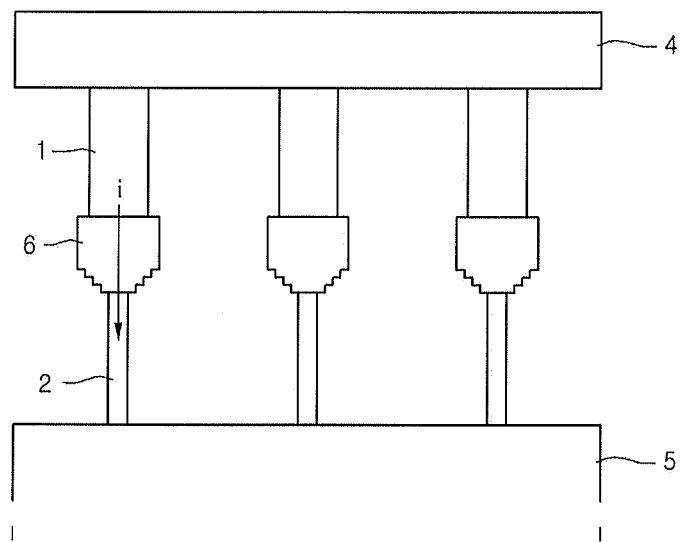
FIG. 7 is a planar view showing a power wiring of a panel according to a fourth embodiment of the present disclosure.

FIG. 7 is a planar view showing a power wiring of a panel within a display device according to a fourth embodiment of the present disclosure.

The display device of the fourth embodiment has a similar configuration to those of the first through third embodiments. As such, the components of the fourth embodiment having the same function and shape as those of the first through third embodiments will be referred to by the same reference numbers and names. Also, the description of the fourth embodiment overlapping with the first through third embodiments will be omitted.

Referring to FIG. 7, the power wiring of the panel within the display device according to a fourth embodiment of the present disclosure can include a power supply unit 4, a pixel portion 5, a first power wire 1, a second power wire 2 and a wire connection portion 6.

The power supply unit 4 can apply power voltages to the pixel portion 5 through the first and second power wires 1 and 2.

The width of the second power wire 2 can become narrower than that of the first power wire 1.

The wire connection portion 6 for connecting the first and second power wires 1 and 2 with each other can be formed in such a manner that its width gradually narrows in the stepped shape by enabling its both side edges to gradually progress in inward directions as it goes from the first power wire 1 to the second power wire 2.

Meanwhile, a current "i" flowing from the power supply unit 4 to the second power wire 2 through the first power wire 1 steeply increase at a connection point of the first and second power wires 1 and 2 due to a steep increment of the resistance. However, the wire connection portion 6 with the stepped shape enables the resistance against the current "i" flowing from the first power wire 1 to the second power wire 2 to smoothly or gradually increase. As such, damage of the power wiring due to a steep increment of the current "i" can be prevented.

In other words, because the resistance obstructing the flow of a current gradually increases, a current quantity passing through the connection point (i.e., the wire connection portion 6) of the first and second power wire 1 and 2 rarely exceeds a current capacity of the wire connection portion 6.

Figure 8:
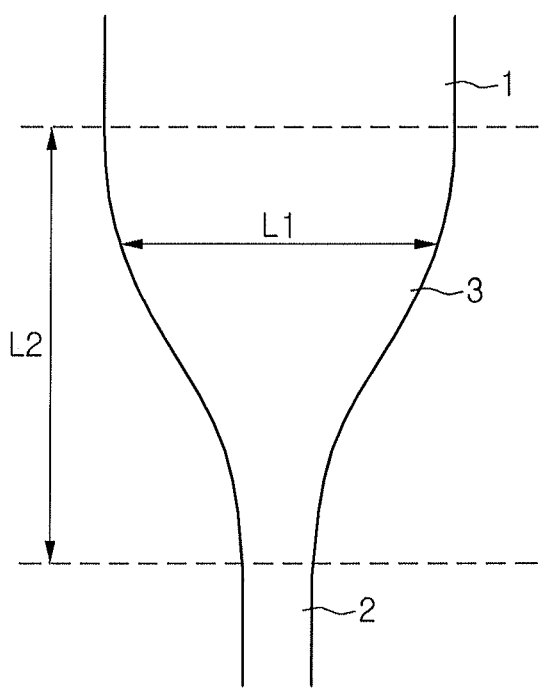
FIGS. 8 and 9 are planar views showing a power wiring of a panel according to a fifth embodiment of the present disclosure.
Figure 9:
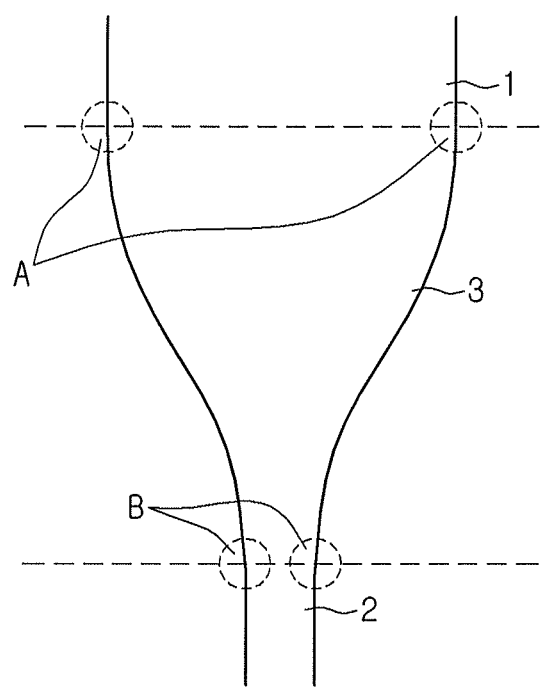

FIGS. 8 and 9 are planar views showing a power wiring of a panel according to a fifth embodiment of the present disclosure.

The display device of the fifth embodiment has a similar configuration to those of the first through fourth embodiments. As such, the components of the fifth embodiment having the same function and shape as those of the first through fourth embodiments will be referred to by the same reference numbers and names. Also, the description of the fifth embodiment overlapping with the first through fourth embodiments will be omitted.

Referring to FIG. 8, the power wiring of the panel within the display device according to a fifth embodiment of the present disclosure can include a first power wire 1, a second power wire 2 and a wire connection wire 3.

The second power wire 2 can be formed to have a narrower width, compared to the first power wire 1.

The wire connection portion 3 is used for connecting the first power wire 1 with the second power wire 2. Such a wire connection portion 3 gradually narrows in width as it goes from the first power wire 1 to the second power wire 2.

In other words, the wire connection portion 3 is extended from the first power wire 1 in such a manner as to gradually narrow to the width of the second power wire 2, and connected to the second power wire 2.

More specifically, the wire connection portion 3 with the narrowing width can include both side edges, which progress from the first power wire 1 to the second power wire 2 in a curved line shape.

The first and second power wires 1 and 2 and the wire connection portion 3 can be formed in a single body through the same process.

As shown in FIG. 9, one end A of the edge of the wire connection portion 3 extended from the first power wire 1 is inwardly rounded. On the other hand, the other end B of the edge of the wire connection portion 3 is outwardly rounded.

In order to form both ends A and B of the edge of the wire connection portion 3 in the inward and outward round shapes, both end of the wire connection portion 3 can be adjusted in width.

In detail, one end of the wire connection portion 3 extended from the first power wire 1 gradually can narrow after maintaining the same width as the first power wire 1. Meanwhile, the other end of the wire connection portion extended from the second power wire 2 can widen after maintaining the same width as the second power wire 2.

In this manner, the wire connection portion 3 can gradually narrow in width by progressing both side edges from the first power wire 1 to the second power wire 2 in a curved ling shape without any angular portion. As such, the display device of the present disclosure can efficiently prevent a current concentration phenomenon, which can cause an overcurrent. Also, the display device can thoroughly protect the wiring from static electricity, which can be generated in an angular portion.

Figure 10:
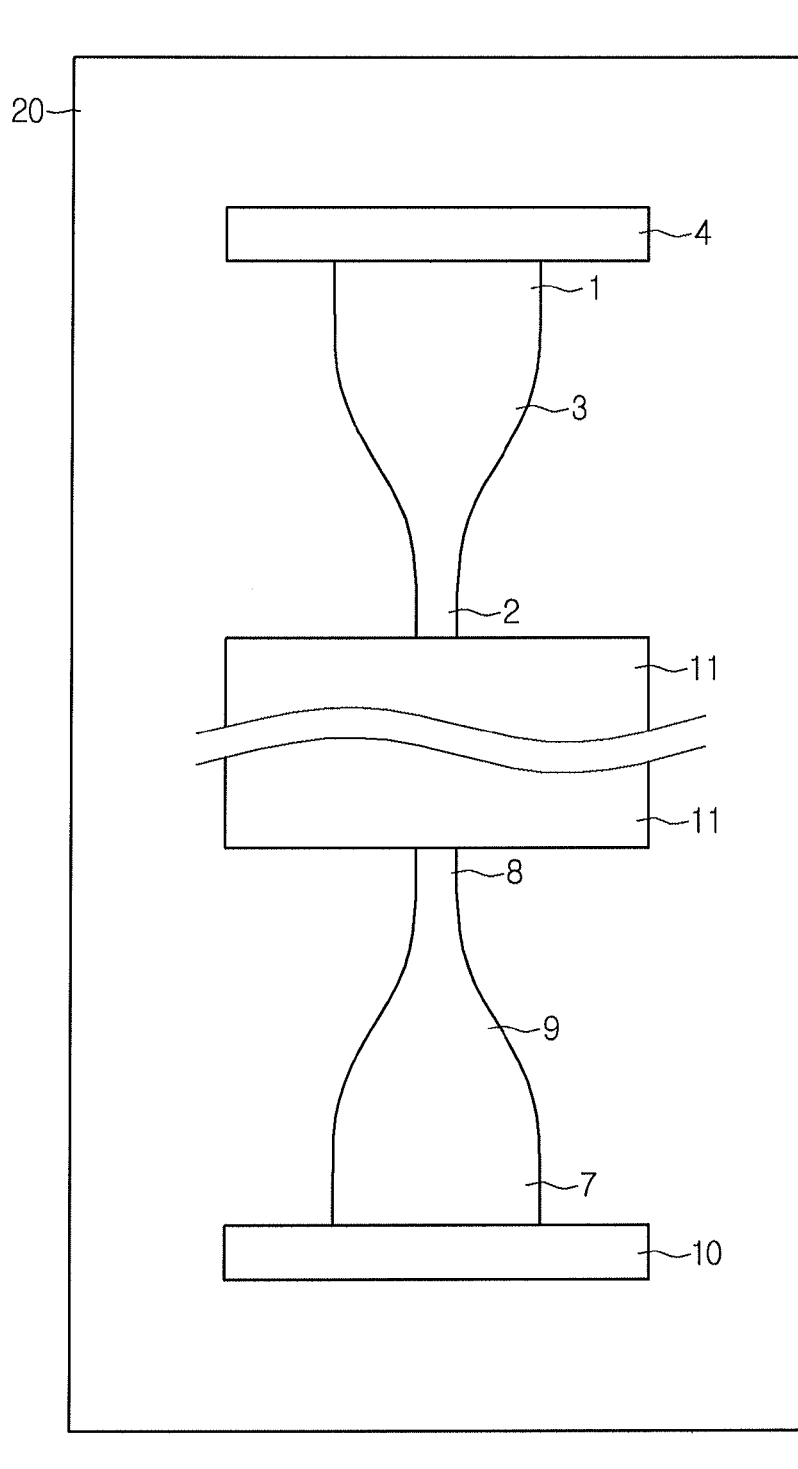
FIG. 10 is a planar views a wiring formed a panel.

FIG. 10 is a planar views a wiring formed a panel.

Referring to FIG. 10, first and second power wires 1 and 2, a first wire connection portion 3, a power supply unit 4 applying a voltage to the first power wire 1, and a pad portion 11 are formed on a top edge region of a panel 20. The pad portion 11 on the top edge region of the panel 20 is used to transfer the voltage on the second power wire 2 to an internal signal wiring of a pixel portion 5. Also, a first wire 7 connected to a circuit substrate 10, a second wire 8 connected to the first wire 7 via a second wire connection portion 9, and the pad portion 11 connected to the second wire 8 are formed on a bottom edge region of the panel 20 in a symmetrical shape with those on the top edge region.

The first and second wires 7 and 8 can be used as one of data and gate lines. Alternatively, the first and second wires 7 and 8 can have the same function as the first and second power wires 1 and 2 on the top edge region.

Also, the first and second wires 7 and 8 and the second wire connection portion 9 can be formed from the same material.

The circuit substrate 10 can provide a suitable signal for the purpose of the first and second wires. The pad portion 11 can be used for connecting the first and second wires 7 and 8 with a variety of signal wires within the pixel portion 5.

In this way, symmetrical wirings can be formed on both edge regions of the panel 20 opposite to each other. For example, wirings can be symmetrically formed with each other on top and bottom edge regions of the panel 20.

Although the first and second wires 7 and 8 on the bottom edge region of the panel 20 have no relation to the generation of an overcurrent, the first and second wires 7 and 8 can be formed simultaneously and symmetrically with the first and second power wires 1 and 2. As such, the manufacturing procedure of the display device can be simplified.

Although the present disclosure has been limitedly explained regarding only the embodiments described above, it should be understood by the ordinary skilled person in the art that the present disclosure is not limited to these embodiments, but rather that various changes or modifications thereof are possible without departing from the spirit of the present disclosure. Accordingly, the scope of the present disclosure shall be determined only by the appended claims and their equivalents without being limited to the description of the present disclosure.

What is claimed is:

1. A display device comprising:
   a pixel portion; and
   a power wiring connected to the pixel portion and including a first power wire, a second power wire which has a narrower width than that of the first power wire and extends from the pixel portion, and a wire connection portion connected between the first and second power wires,
   wherein the wire connection portion gradually narrows in width as it goes from the first power wire toward the second power wire.

2. The display device of claim 1, wherein the first and second power wires and the wire connection portion are formed in a single body.

3. The display device of claim 1, wherein the first and second power wires and the wire connection portion are of the same material.

4. The display device of claim 1, wherein the wire connection portion with the narrowing width includes both side edges which inwardly progress in a curved line shape from the first power wire to the second power wire.

5. The display device of claim 4, wherein one end of the edge of the wire connection portion is rounded in an inward direction, and the other end of the edge of the wire connection portion is rounded in an outward direction.

6. A display device comprising:
   a pixel portion; and
   a power wiring connected to the pixel portion and including a first power wire, a second power wire has a narrower width than that of the first power wire and extends from the pixel portion, and a wire connection portion which is connected between the first and second power wires,
   wherein the wire connection portion is in a stepped shape.

7. The display device of claim 6, wherein the wire connection portion gradually narrows in width as it goes from the first power wire toward the second power wire.

8. The display device of claim 6, wherein the first and second power wires and the wire connection portion are formed in a single body.

9. The display device of claim 6, wherein the first and second power wires and the wire connection portion are of the same material.

10. The display device of one of claims 1 and 6, wherein the first and second power wires and the wire connection portion are symmetrically formed in both side edge regions of a panel opposite to each other.

* * * * *